United States Patent
Kim et al.

(10) Patent No.: US 9,261,588 B2
(45) Date of Patent: Feb. 16, 2016

(54) RADAR APPARATUS AND METHOD MANUFACTURING THE SAME

(71) Applicant: MANDO CORPORATION, Pyeongtaek-Si, Gyeonggi-do (KR)

(72) Inventors: Min Seok Kim, Gyeonggi-do (KR); Seong Hee Jeong, Seoul (KR); Seung Un Choi, Seoul (KR); Jae Eun Lee, Gyeonggi-do (KR)

(73) Assignee: MANDO CORPORATION, Yeongtaek-si Gyeonggi-do (KR)

( * ) Notice: Subject to any disclaimer, the term of this patent is extended or adjusted under 35 U.S.C. 154(b) by 345 days.

(21) Appl. No.: 13/744,088

(22) Filed: Jan. 17, 2013

(65) Prior Publication Data

US 2013/0181864 A1    Jul. 18, 2013

(30) Foreign Application Priority Data

Jan. 17, 2012    (KR) .................. 10-2012-0005213

(51) Int. Cl.
| | |
|---|---|
| *G01S 7/02* | (2006.01) |
| *G01S 13/02* | (2006.01) |
| *H05K 13/04* | (2006.01) |
| *G01S 7/03* | (2006.01) |
| *G01S 13/93* | (2006.01) |
| *H01Q 21/06* | (2006.01) |
| *H01Q 1/32* | (2006.01) |

(52) U.S. Cl.
CPC ............... *G01S 13/02* (2013.01); *G01S 7/032* (2013.01); *G01S 13/931* (2013.01); *H01Q 1/3233* (2013.01); *H01Q 21/061* (2013.01); *H05K 13/04* (2013.01); *G01S 2007/028* (2013.01); *Y10T 29/49018* (2015.01)

(58) Field of Classification Search
CPC . G01S 7/032; G01S 13/931; G01S 2007/028; H01Q 1/3233; Y10T 29/49018
USPC ..................................... 342/70, 175
See application file for complete search history.

(56) References Cited

U.S. PATENT DOCUMENTS

| 6,452,550 B1 | 9/2002 | Channabasappa et al. |
| 7,733,265 B2 * | 6/2010 | Margomenos et al. ......... 342/70 |
| 2006/0152406 A1 * | 7/2006 | Leblanc et al. ............... 342/175 |

(Continued)

FOREIGN PATENT DOCUMENTS

| CN | 101076741 A | 11/2007 |
| EP | 0978729 A2 | 2/2000 |

(Continued)

*Primary Examiner* — John B Sotomayor
*Assistant Examiner* — Marcus Windrich
(74) *Attorney, Agent, or Firm* — McDermott Will & Emery LLP

(57) ABSTRACT

A radar apparatus includes a printed circuit board having a top side, on which a radar antenna unit and an RF circuit unit are mounted, and a bottom side, on which a base band circuit unit and a signal processing circuit unit are mounted. A base plate is coupled to the printed circuit board. A protective member is coupled to the top side of the printed circuit board to cover the RF circuit unit in order to protect the RF circuit unit. The protective member has a groove formed on one side thereof, which serves as a passage of a wire for connecting the radar antenna unit and the RF circuit unit mounted on the top side of the printed circuit board.

11 Claims, 8 Drawing Sheets

(56) References Cited

U.S. PATENT DOCUMENTS

2006/0226415 A1* 10/2006 Nishijima et al. ............... 257/11
2007/0040735 A1*  2/2007 Matsuo et al. ................. 342/175
2008/0062038 A1*  3/2008 Ouchi et al. .................. 342/175
2008/0258964 A1* 10/2008 Schoeberl et al. ............. 342/189
2009/0135043 A1*  5/2009 Leblanc et al. .................... 342/1
2010/0225539 A1*  9/2010 Margomenos et al. ....... 342/373

FOREIGN PATENT DOCUMENTS

| EP | 1898231 A1 | 3/2008 |
| JP | 2000-059140 A | 2/2000 |
| JP | 2003-133801 A | 5/2003 |
| JP | 2010-093399 A | 4/2010 |
| KR | 10-1052041 B1 | 7/2011 |
| KR | 10-2011-0096676 A | 8/2011 |

* cited by examiner

RADAR APPARATUS AND METHOD MANUFACTURING THE SAME

CROSS-REFERENCE TO RELATED APPLICATION

This application claims priority from and the benefit under 35 U.S.C. §119(a) of Korean Patent Application No. 10-2012-0005213, filed on January 17, which is hereby incorporated by reference for all purposes as if fully set forth herein.

BACKGROUND OF THE INVENTION

1. Field of the Invention

The present invention relates to a radar apparatus.

2. Description of the Prior Art

A conventional radar apparatus separately includes a printed circuit board (PCB) on which a radar antenna unit is mounted, a printed circuit board on which an RF circuit unit is mounted, and also includes a transition unit and a wave guide for signal transmission between the radar antenna unit mounted PCB and the RF circuit unit mounted PCB. Accordingly, it is unavoidable that the radar apparatus has a large size.

In addition, since the conventional radar apparatus also includes a connection unit to interconnect a signal processing circuit unit mounted PCB and the RF circuit unit mounted PCB, there is a problem in that the radar apparatus unavoidably has a large size.

Due to this, there is a problem in that the position for installing the radar apparatus in a vehicle is unavoidably restrictive which also affects a vehicle design.

SUMMARY OF THE INVENTION

Accordingly, the present invention has been made to solve the above-mentioned problems occurring in the prior art, and an object of the present invention is to provide a radar apparatus configured to be reduced in the number of elements and size, and a method of assembling the same.

Another object of the present invention is to provide a radar apparatus which does not substantially affect a vehicle design, and a method of assembling the same.

In order to accomplish this object, there is provided a radar apparatus including: a printed circuit board having a top side, on which a radar antenna unit and an RF circuit unit are mounted, and a bottom side, on which a base band circuit unit and a signal processing circuit unit are mounted; a base plate coupled to the printed circuit board; and a protective member coupled to the top side of the printed circuit board to cover the RF circuit unit in order to protect the RF circuit unit.

The protective member may be formed with a groove that serves as a passage of a wire for connecting the radar antenna unit and the RF circuit unit mounted on the top side of the printed circuit board.

The top side of the printed circuit board may include a first portion on which the radar antenna unit is mounted, and a second portion on which the RF circuit unit is wire bonded and mounted. The protective member may have a size that covers the second portion but does not cover the first portion.

The base band circuit unit may convert an analog signal output from the RF circuit unit into a digital signal and inputs the digital signal to the signal processing circuit unit, or convert a digital signal output from the signal processing circuit unit into an analog signal, and inputs the analog signal to the RF circuit unit.

One end of the RF circuit unit may be connected with the radar antenna unit, and the other end of the RF circuit unit may be connected, in circuit, with the base band circuit unit.

The RF circuit unit mounted on the top side of the printed circuit board may be seated on the base plate through a hole formed in the printed circuit board.

The base plate may be formed with a protrusion to allow the RF circuit unit to be seated thereon.

The top side of the printed circuit board may include a first portion on which the radar antenna unit is mounted and a second portion on which the RF circuit unit is mounted. The radar antenna unit mounted on the first portion may include a plurality of long-distance transmission array antennas, one or more short-distance transmission array antennas, and a plurality of reception array antennas.

All the plurality of long-distance transmission array antennas may have the same antenna length, or one or more long-distance transmission array antennas among the plurality of long-distance transmission array antennas may have a different length.

When the one or more long-distance transmission array antennas among the plurality of long-distance transmission array antennas have a different length, there may be provided an antenna configuration in which the long-distance transmission array antenna arranged at the center of the plurality of long-distance transmission array antennas has the longest length and the lengths of the other long-distance transmission array antennas decrease as approaching the opposite sides.

In accordance with another aspect of the present invention, there is provided a method of assembling a radar apparatus including: mounting a radar antenna unit on the top side of a printed circuit board; mounting a base band circuit unit and a signal processing circuit unit on the bottom side of the printed circuit board; mounting an RF circuit unit on the top side of the printed circuit board; coupling a protective member to the top side of the printed circuit board to cover the RF circuit unit; and coupling a base plate to the printed circuit board.

In the RF circuit unit mounting step, the RF circuit unit may be seated on the base plate through a hole formed in the printed circuit board.

As described above, according to the present invention, it is possible to provide a radar apparatus 100 having a configuration which is reduced in the number of parts and in size, and a method of assembling the same.

In addition, according to the present invention, it is possible to provide a radar apparatus which does not substantially affects a vehicle design, and a method of assembling the same.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
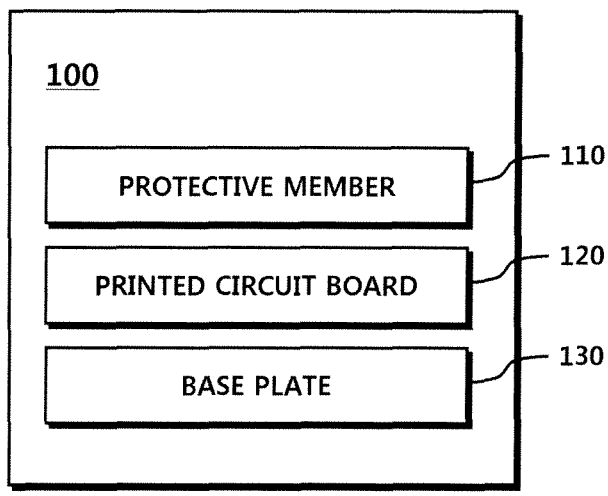
FIG. 1 is a block diagram of a radar apparatus according to an exemplary embodiment of the present invention.

Hereinafter, exemplary embodiments of the present invention will be described with reference to the accompanying drawings. In the following description, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). It should be noted that if it is described in the specification that one component is "connected," "coupled" or "joined" to another component, a third component may be "connected," "coupled," and "joined" between the first and second components, although the first component may be directly connected, coupled or joined to the second component.

FIG. 1 is a block diagram of a radar apparatus 100 according to an exemplary embodiment of the present invention.

Referring to FIG. 1, the radar apparatus 100 according to the exemplary embodiment of the present invention includes a printed circuit board 120, on the top side of which a radar antenna unit and an RF circuit unit is mounted, and on the bottom side of which a base band circuit unit and a signal processing circuit unit is mounted, and a base plate 130 coupled to the printed circuit board 120.

Referring to FIG. 1, the radar apparatus 100 of the present exemplary embodiment may further include a protective member 110 configured to cover the RF circuit unit and coupled to the top side of the printed circuit board 120 to protect the RF circuit unit mounted on the top side of the printed circuit board 120.

The protective member 110 may be formed with a groove that serves as a passage of a wire that connects the radar antenna unit and the RF circuit unit mounted on the top side of the printed circuit board 120 in circuit.

The protective member 110 may be formed of a metallic material.

The top side of the printed circuit board 120 may include a first portion on which the radar antenna unit and a second portion on which the RF circuit unit is wire bonded and mounted.

As described above, the protective member 110 may have a size that covers the second portion on which the RF circuit unit is wire bonded and mounted but does not cover the first portion on which the radar antenna unit is mounted in the top side of the printed circuit board 120 so as not to interfere with the signal transmission and reception of the radar antenna unit while protecting the RF circuit unit but.

The radar antenna unit mounted on the first portion in the top side of the printed circuit board 120 may include, for example, a plurality of long-distance transmission array antennas, one or more short-distance transmission array antennas, and a plurality of reception array antennas.

If the radar antenna unit includes the plurality of long-distance transmission array antennas, and the one or more short-distance transmission array antennas, the radar apparatus 100 can perform both of a long-distance sensing and a short-distance sensing.

In connection with this, the number of antennas in the plurality of long-distance transmission array antennas may be determined according to, for example, a sensing distance and a sensing angle for the long-distance sensing. In addition, the number of antennas in the one or more short-distance transmission array antennas may be determined according to, for example a sensing distance and a sensing angle for the short-distance sensing.

Meanwhile, all the plurality of long-distance transmission array antennas may have the same antenna length, or one or more long-distance transmission array antenna among the plurality of long-distance transmission array antennas may have a different antenna length.

If one or more long-distance transmission array antennas among the plurality of long-distance transmission array antennas have a different antenna length, there may be provided an antenna configuration in which the long-distance transmission array antenna arranged at the center of the plurality of long-distance transmission array antennas may have the longest length, and the antenna lengths of the other long-distance transmission array antennas decrease as approaching the opposite sides.

Descriptions will be made as to a circuit connection configuration of the radar antenna unit and the RF circuit unit mounted on the top side of the printed circuit board 120 and the base band circuit unit and the signal processing circuit unit mounted on the bottom side of the printed circuit board 120.

First, the circuit connection configuration between the radar antenna unit, the RF circuit unit, and the base band circuit unit is as follows.

One end of the RF circuit unit mounted on the top side of the printed circuit board 120 may be connected with the radar antenna unit mounted on the top side of the printed circuit board 120, the other end of the RF circuit unit may be connected in circuit with the base band circuit unit mounted on the bottom side of the printed circuit board 120.

Next, the circuit connection configuration between the RF circuit unit, the base band circuit unit, and the signal processing circuit unit is as follows.

The base band circuit unit mounted on the bottom side of the printed circuit board 120 performs an analog-digital conversion function. For this purpose, the base band circuit unit may convert an analog signal output from the RF circuit unit mounted on the top side of the printed circuit board 120 into a digital signal, and input the digital signal to the signal processing circuit unit mounted on the bottom side of printed circuit board 120, or convert a digital signal output from signal processing circuit unit mounted on the bottom side of the printed circuit board 120 into an analog signal and input the analog signal to the RF circuit unit mounted on the top side of the printed circuit board 120.

Meanwhile, the RF circuit unit mounted on the top side of the printed circuit board 120 may be wire bonded and mounted on the top side of the printed circuit board 120, directly seated on the top side of the printed circuit board 120, or seated on the base plate 130 through a hole formed in the printed circuit board 120.

That is, the RF circuit unit mounted on the top side of the printed circuit board 120 may be seated on the printed circuit board 120 or on the base plate 130.

Hereinbelow, the radar apparatus 100 will be described in connection with a case where the RF circuit unit is seated on the top side of the printed circuit board 120, and a case where the RF circuit unit is seated on the base plate 130 with reference to FIGS. 2 to 5.

First, the radar apparatus 100 in which the RF circuit unit mounted on the top side of the printed circuit board 120 is seated on the base plate 130 will be described with reference to the exploded perspective view of FIG. 2 and the circuit diagram of FIG. 3.

Figure 2:
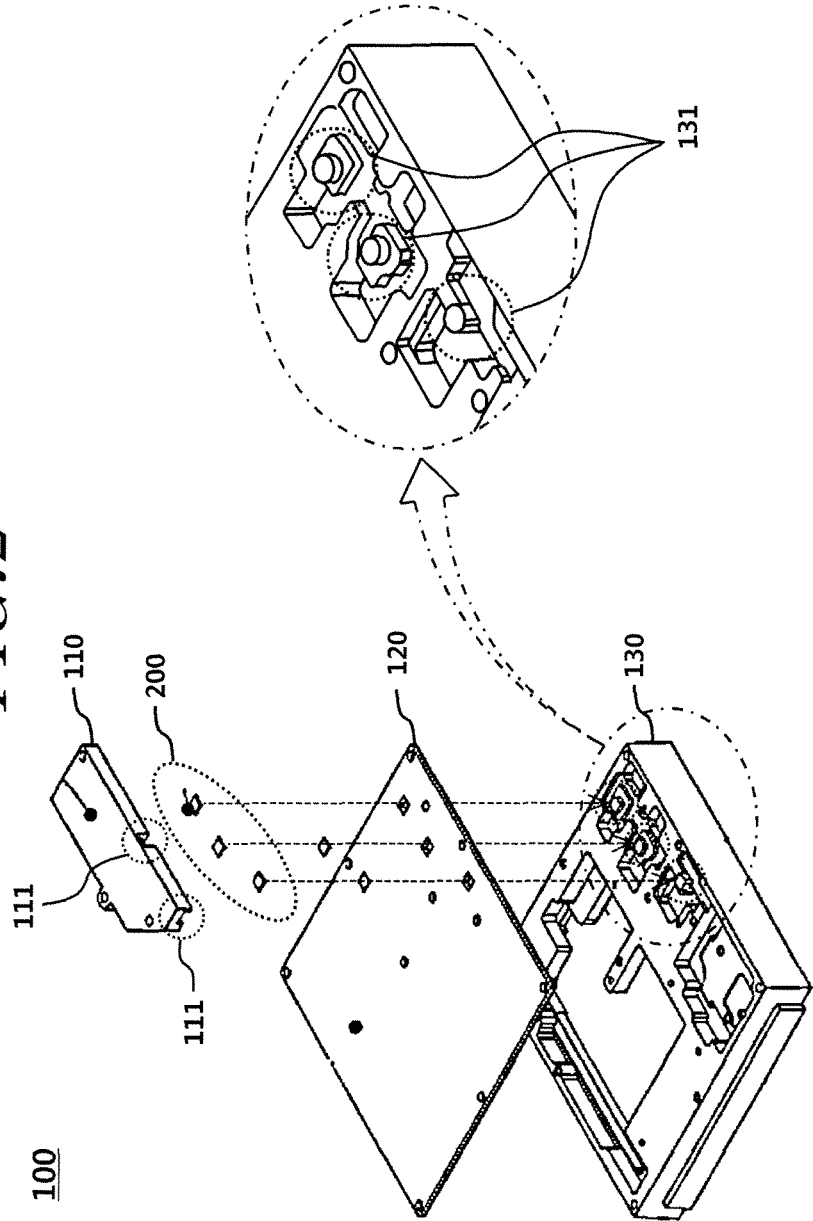
FIG. 2 is an exploded perspective view of a radar apparatus in which an RF circuit unit is seated on a base plate.

FIG. 2 is an exploded perspective view of the radar apparatus 100 in which the RF circuit unit mounted on the top side of the printed circuit board 120 is seated on the base plate 130.

As illustrated in FIG. 2, the radar apparatus 100 may include a protective member 110, a printed circuit board 120, and a base plate 130.

On the top side of the printed circuit board 120, an RF circuit unit 200 is mounted together with a radar antenna unit.

The protective member 110 is coupled to the top side of the printed circuit board 120 to cover the RF circuit unit 200 mounted on the top side of the printed circuit board 120 in order to protect the RF circuit unit 200.

The protective member 110 may be formed with a groove 111 that serves as a passage of a wire for interconnecting in circuit the radar antenna unit and the RF circuit unit mounted on the top side of the printed circuit board 120.

In the radar apparatus 100 of FIG. 2, the RF circuit unit 200 is mounted on the top side of the printed circuit board 120 together with the radar antenna unit, and seated on the base plate 130 through a hole formed in the printed circuit board 120.

Like this, when the RF circuit unit mounted on the top side of the printed circuit board 120 is seated on the base plate 130, that is, when the RF circuit unit mounted on the top side of the printed circuit board 120 is seated on the base plate 130 through the hole formed in the printed circuit board 120, the base plate 130 may be formed with a protrusion 131 as illustrated in FIG. 2 to allow the RF circuit unit to be seated.

Figure 3:
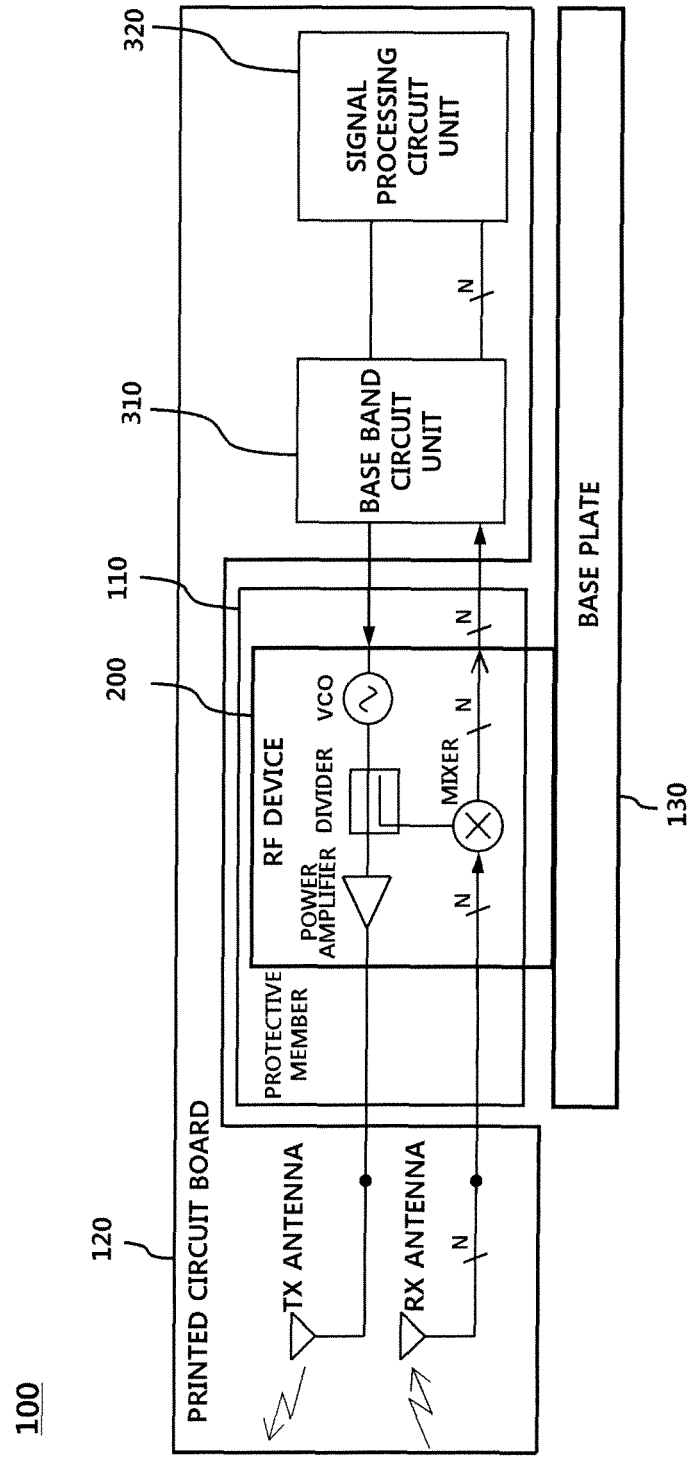
FIG. 3 is a circuit diagram of the radar apparatus in which the RF circuit unit is seated on the base plate.

FIG. 3 is a circuit diagram of the radar apparatus 100 in which the RF circuit unit 200 is seated on the base plate 130.

Meanwhile, as described above, in the radar apparatus 100 of the present exemplary embodiment, the radar antenna unit and RF circuit unit 200 are mounted on the top side of the single printed circuit board 120 in unison rather than being mounted on separated printed circuit boards, respectively. For this purpose, in the present exemplary embodiment, the RF circuit unit 200 may be implemented as a single chip or two or more chips. Accordingly, the RF circuit unit 200 is depicted and referred to as an "RF device 200" in the circuit diagram FIG. 3, and in the following description.

Referring to FIG. 3, a radar antenna unit (Tx antenna, Rx antenna) mounted on the top side of the printed circuit board 120, is connected with one end of the RF device 200 covered by the protective member 110.

The other end of the RF device 200 covered by the protective member 110 is connected, in circuit, with a base band circuit unit 310 mounted on the printed circuit board 120.

In addition, the base band circuit unit 310 is connected, in circuit, with a signal processing circuit unit 320 that is mounted on the bottom side of the printed circuit board 120 together with the base band circuit unit 310.

Meanwhile, the RF device 200 covered by the protective member 110 is mounted on the top side of the printed circuit board 120 and seated on the base plate 130.

The base plate 130 functions as an assembling structure of the radar apparatus 100 and allows the RF circuit unit 200 to be seated thereon.

In addition, the base plate 130 may also transfer heat generated within the radar apparatus 100, and shield noise.

Next, the radar apparatus 100, in which an RF circuit unit 200 mounted on the top side of a printed circuit board 120 is seated on the printed circuit board 120 will be described with reference to the exploded perspective view of FIG. 4 and the circuit diagram of FIG. 5.

Figure 4:
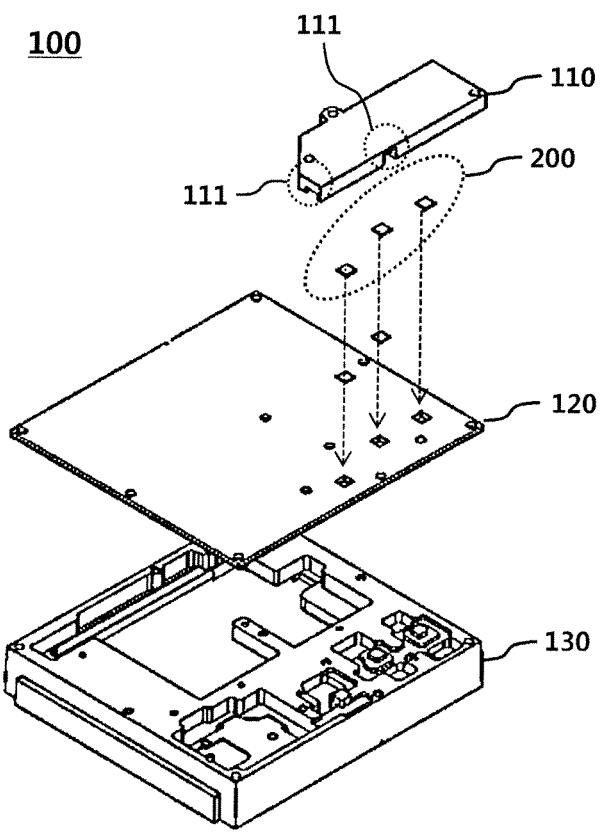
FIG. 4 is an exploded perspective view of a radar apparatus in which the RF circuit unit is seated on a printed circuit board.

FIG. 4 is an exploded view of the radar apparatus 100 in which an RF circuit unit 200 is seated on a printed circuit board 120.

As illustrated in FIG. 4, the radar apparatus 100 may include a protective member 110, a printed circuit board 120, and a base plate 130.

On the top side of the printed circuit board 120, an RF circuit unit 200 is mounted together with a radar antenna unit.

The protective member 110 is coupled to the top side of the printed circuit board 120 to cover the RF circuit unit 200 mounted on the top side of the printed circuit board 120 to protect the RF circuit unit 200.

The protective member 110 may be formed with a groove 111 that serves as a passage of a wire for interconnecting, in circuit, the radar antenna unit and the RF circuit unit mounted on the top side of the printed circuit board 120

In the radar apparatus 100 of FIG. 4, the RF circuit unit 200 is mounted on the top side of the printed circuit board 120 together with the radar antenna unit, and seated on the printed circuit board 120 as it is.

The radar apparatus 100 of FIG. 4 is the same as the radar apparatus 100 of FIG. 2 except for the seated position of the RF circuit unit 200.

Figure 5:
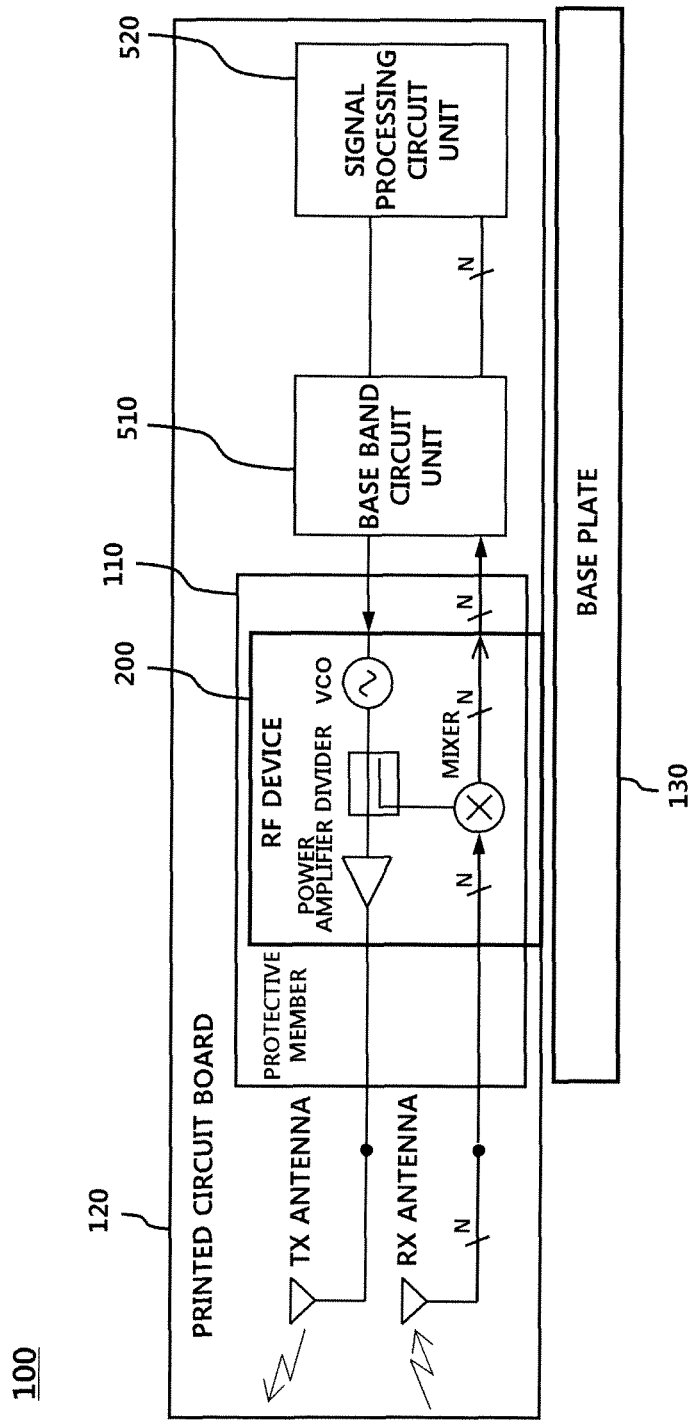
FIG. 5 is a circuit diagram of the radar apparatus in which the RF circuit unit is seated on the printed circuit board

FIG. 5 is a circuit diagram of the radar apparatus 100 in which the RF circuit unit 200 is seated on the printed circuit board 120.

Meanwhile, as described above, in the radar apparatus 100 according to the present exemplary embodiment, the radar antenna unit and the RF circuit unit 200 are mounted on the top side of the single printed circuit board 120 in unison, rather than being mounted on separate radar antenna printed circuit boards, respectively. For this purpose, in the present exemplary embodiment, the RF circuit unit 200 may be implemented as a single chip or two or more chips. Accordingly, the RF circuit unit 200 is depicted and referred to as an "RF device 200" in the circuit diagram FIG. 5, and in the following description.

Referring to FIG. 5, a radar antenna unit ((Tx antenna, Rx antenna) mounted on the top side of the printed circuit board 120, is connected with one end of the bottom side of the RF device 200 covered by the protective member 110.

The other end of the RF device 200 covered by the protective member 110 is connected, in circuit, with a base band circuit unit 510 mounted on the printed circuit board 120.

In addition, the base band circuit unit 510 is connected, in circuit, with a signal processing circuit unit 520 that is mounted on the bottom side of the printed circuit board 120 together with the base band circuit unit 510.

Meanwhile, the RF device 200 covered by the protective member 110 is wire bonded and mounted on the top side of the printed circuit board 120 and seated on printed circuit board 120 as it is.

The base plate 130 functions as an assembling structure of the radar apparatus 100 and allows the RF circuit unit 200 to be seated thereon In addition, the base plate 130 may also transfer heat generated within the radar apparatus 100, and shield noise.

Hereinbelow, the configuration of the top side of the printed circuit board 120 will be described illustratively with reference to FIG. 6.

Figure 6:
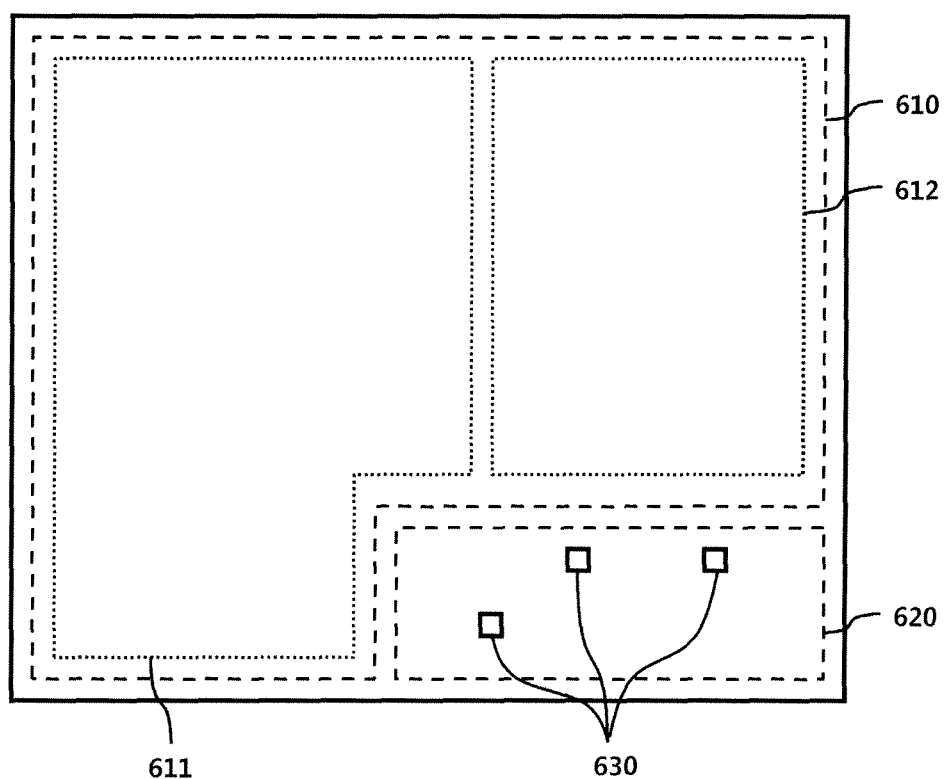
FIG. 6 illustrates a configuration of the top side of a printed circuit board in a radar apparatus according to an exemplary embodiment of the present invention.

FIG. 6 illustrates a configuration of the top side of a printed circuit board 120 in a radar apparatus 100 according to an exemplary embodiment of the present invention.

Referring to FIG. 6, the top side of the printed circuit board 120 includes a first portion 610 on which a radar antenna unit is mounted and a second portion 620 on which an RF circuit unit is mounted.

In addition, the first portion 610 on which the radar antenna unit is mounted is divided into a transmission antenna unit mounted portion 611, and a reception antenna unit mounted portion 612.

In addition, the printed circuit board 120 included in the radar apparatus 100 of FIG. 2 may be formed with holes 630 on the top side thereof as illustrated in FIG. 6, such that the RF circuit unit 200 penetrates through the holes 630 when the RF circuit unit 200 is mounted.

The top side of the printed circuit board 120 exemplified in FIG. 6 is formed with three holes 630, assuming that the RF circuit unit 200 are implemented by three chips. Here, the three chips may be, for example, one transmission integrated circuit chip and two reception integrated circuit chips, or two transmission integrated circuit chips and one reception integrated circuit chip.

If the RF circuit unit 200 is implemented by one chip (a transmission/reception integrated circuit chip), only one hole 630 may be formed on the top side of the printed circuit board 120.

In addition, when the RF circuit unit 200 is implemented by two chips (one transmission integrated circuit chip and one reception integrated circuit chip), two holes 630 may be formed on the top side of the printed circuit board 120.

Figure 7:
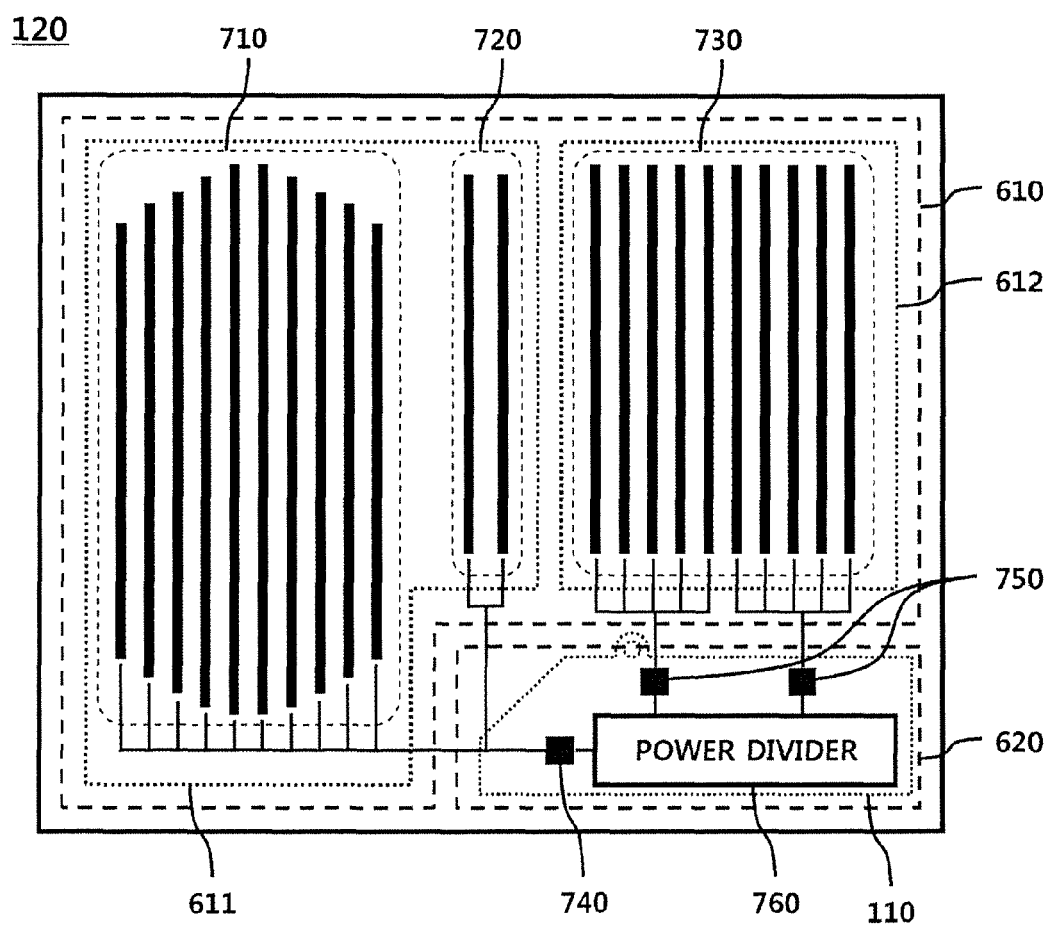
FIG. 7 exemplifies a printed circuit board having a top side on which, for example, a radar antenna unit and an RF circuit unit are mounted in a radar apparatus according to an exemplary embodiment of the present invention.

An appearance of the radar antenna unit and the RF circuit unit 200 practically mounted on the top side of the printed circuit board 120 having the configuration exemplified in FIG. 6 is illustrated in FIG. 7.

FIG. 7 exemplifies a printed circuit board 120 on the top side of which, for example, a radar antenna unit and an RF circuit unit 200 are mounted in a radar apparatus 100 according to an exemplary embodiment of the present invention.

In FIG. 7, the radar antenna unit may include a transmission antenna unit implemented by, for example, ten long-distance transmission array antennas 710 and two short-distance transmission array antennas 720, and a reception antenna unit implemented by ten reception array antennas 730.

The transmission antenna unit implemented by the ten long-distance transmission array antennas 710 and the two short-distance transmission array antennas 720 is mounted on the transmission antenna unit mounted portion 611 in the first portion 610 where the radar antenna unit is mounted.

The reception antenna unit implemented by the ten reception array antennas 730 is mounted on the reception antenna unit mounted portion 612 in the first portion 610 where the radar antenna unit is mounted.

In FIG. 7, the RF circuit unit 200 mounted on the top side of the printed circuit board 120 is implemented as three chips. That is, the RF circuit unit 200 is implemented as one transmission integrated circuit chip 740 and two reception integrated circuit chips 750.

The one transmission integrated circuit chip 740 and the two reception integrated circuit chips 750 are wire bonded and mounted on the top side of the printed circuit board 120 at the points where three holes 630 are formed.

In addition, the one transmission integrated circuit chip 740 is connected with each of the ten long-distance transmission array antennas 710 and the two short-distance transmission array antennas 720.

The two reception integrated circuit chips 750 are connected with each of the ten reception array antennas 730.

In addition, the one transmission integrated circuit chip 740 and the two reception integrated circuit chips 750 are connected with a power divider 760, which in turn divides power to each of the ten long-distance transmission array antennas 710, the two short-distance transmission array antennas 720 and the ten reception array antennas 730.

The power divider 760 may be controlled in such a manner that it divides power to each of the ten long-distance transmission array antennas 710 in such a manner that the highest power is applied to one or more long-distance transmission array antennas arranged at the center of the ten long-distance transmission array antenna 710, and the supplied power decreases as approaching the opposite sides from the one or more long-distance transmission array antennas arranged at the center.

Figure 8:
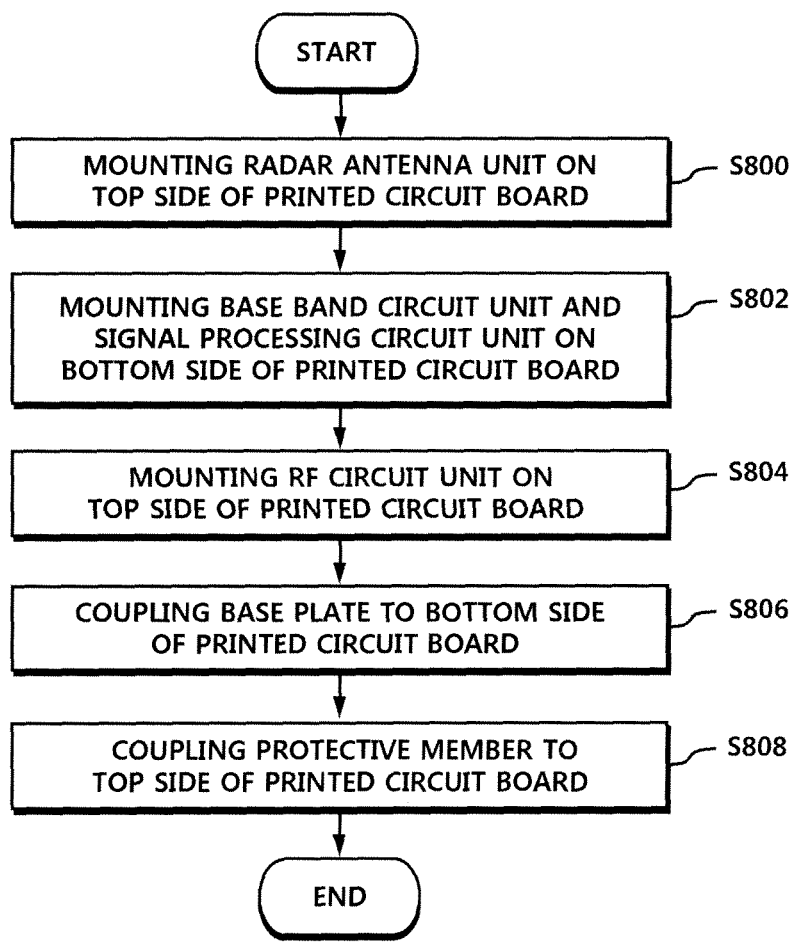
FIG. 8 is a flowchart of a method of assembling a radar apparatus according to an exemplary embodiment of the present invention.

FIG. 8 is a flowchart of a method of assembling a radar apparatus according to an exemplary embodiment.

Referring to FIG. 8, the method of a radar apparatus 100 according to the present exemplary embodiment, includes: mounting a radar antenna unit on the top side of the printed circuit board 120 (S800); mounting a base band circuit unit and a signal processing circuit unit on the bottom side of the printed circuit board 120 (S802); mounting an RF circuit unit on the top side of the printed circuit board 120 (S804); and coupling a base plate 130 to the printed circuit board 120 (S806).

In the RF circuit unit mounting step (S804), the RF circuit unit may be seated on the base plate 130 through a hole formed in the printed circuit board 120, or directly seated on the top side of the printed circuit board 120.

As illustrated in FIG. 8, the method of assembling a radar apparatus 100 according to the present exemplary embodiment may further include coupling a protective member 110 to the top side of the printed circuit board 120 (S808) after the RF circuit unit mounting step (S804). The protective member 110 is configured to cover the RF circuit unit mounted on the top side of the printed circuit board 120.

As described above, according to the present invention, it is possible to provide a radar apparatus 100 having a configuration which is reduced in the number of parts and in size, and a method of assembling the same.

In addition, according to the present invention, it is possible to provide a radar apparatus 100 which does not substantially affect a vehicle design, and a method of assembling the same.

Even if it was described above that all of the components of an embodiment of the present invention are coupled as a single unit or coupled to be operated as a single unit, the present invention is not necessarily limited to such an embodiment. That is, among the components, one or more components may be selectively coupled to be operated as one or more units. In addition, although each of the components may be implemented as an independent hardware, some or all of the components may be selectively combined with each other, so that they can be implemented as a computer program having one or more program modules for executing some or all of the functions combined in one or more hardwares. Codes and code segments forming the computer program can be easily conceived by an ordinarily skilled person in the technical field of the present invention. Such a computer program may implement the embodiments of the present invention by being stored in a computer readable storage medium, and being read and executed by a computer. A magnetic recording medium, an optical recording medium, a carrier wave medium, or the like may be employed as the storage medium.

In addition, since terms, such as "including," "comprising," and "having" mean that one or more corresponding components may exist unless they are specifically described to the contrary, it shall be construed that one or more other components can be included. All of the terminologies containing one or more technical or scientific terminologies have the same meanings that persons skilled in the art understand ordinarily unless they are not defined otherwise. A term ordinarily used like that defined by a dictionary shall be construed that it has a meaning equal to that in the context of a related description, and shall not be construed in an ideal or excessively formal meaning unless it is clearly defined in the present specification.

Although a preferred embodiment of the present invention has been described for illustrative purposes, those skilled in the art will appreciate that various modifications, additions and substitutions are possible, without departing from the scope and spirit of the invention as disclosed in the accompanying claims. Therefore, the embodiments disclosed in the present invention are intended to illustrate the scope of the technical idea of the present invention, and the scope of the present invention is not limited by the embodiment. The scope of the present invention shall be construed on the basis of the accompanying claims in such a manner that all of the technical ideas included within the scope equivalent to the claims belong to the present invention.

What is claimed is:

1. A radar apparatus comprising:
    a printed circuit board having a top side, on which a radar antenna unit having a plurality of long-distance transmission array antennas and an RF circuit unit are mounted, and
    a bottom side, on which a base band circuit unit and a signal processing circuit unit are mounted;
    a base plate coupled to the printed circuit board; and
    a protective member coupled to the top side of the printed circuit board to cover the RF circuit unit in order to protect the RF circuit unit; and
    a power divider configured to divide a power to each of the plurality of long-distance transmission array antennas such that a highest power is applied to a long-distance transmission array antenna arranged at a center of the plurality of long-distance transmission array antennas and the supplied power decreases as approaching the opposite sides from the long-distance transmission array antenna arranged at the center,
    wherein the top side of the printed circuit board comprises a first portion on which the radar antenna unit is mounted, and a second portion on which the RF circuit unit is wire bonded and mounted,
    wherein the protective member covers only the second portion,
    wherein all the plurality of long-distance transmission array antennas have the same physical length, or one or more long-distance transmission array antennas among the plurality of long-distance transmission array antennas have different physical lengths, and
    wherein when the one or more long-distance transmission array antennas have the different physical lengths, the long-distance transmission array antenna arranged at the center has the longest physical length and the physical lengths of the remaining long-distance transmission array antennas decrease as approaching the opposite sides.

2. The radar apparatus of claim 1, wherein the protective member is formed with a groove that serves as a passage of a wire for connecting the radar antenna unit and the RF circuit unit mounted on the top side of the printed circuit board.

3. The radar apparatus of claim 1, wherein the base band circuit unit converts an analog signal output from the RF circuit unit into a digital signal and inputs the digital signal to the signal processing circuit unit, or converts a digital signal output from the signal processing circuit unit into an analog signal, and inputs the analog signal to the RF circuit unit.

4. The radar apparatus of claim 1, wherein one end of the RF circuit unit is connected with the radar antenna unit, and the other end of the RF circuit unit is connected with the base band circuit unit.

5. The radar apparatus of claim 1, wherein, the RF circuit unit mounted on the top side of the printed circuit board is seated on the base plate through a hole formed in the printed circuit board.

6. The radar apparatus of claim 5, wherein the base plate is formed with a protrusion to allow the RF circuit unit to be seated thereon.

7. The radar apparatus of claim 1,
    wherein the radar antenna unit mounted on the first portion comprises the plurality of long-distance transmission array antennas, one or more short-distance transmission array antennas, and a plurality of reception array antennas.

8. The radar antenna of claim 7, wherein the RF circuit unit is implemented as a transmission integrated circuit chip and reception integrated circuit chips.

9. The radar antenna of claim 8, wherein the transmission integrated circuit chip is connected with the each of the plurality of long-distance transmission array antennas and the one or more short-distance transmission array antennas, and the reception integrated circuit chips are connected with each of the plurality of reception array antennas.

10. The radar antenna of claim 9, wherein the transmission integrated circuit chip and the reception integrated circuit chips are connected with the power divider, the one or more short-distance transmission array antennas, and the plurality of reception array antennas.

11. The radar apparatus of claim 1, wherein the radar antenna unit includes ten long-distance transmission array antennas.

* * * * *